United States Patent [19]

Smith

[11] Patent Number: 4,626,823
[45] Date of Patent: Dec. 2, 1986

[54] MINIATURE ELECTRONIC DEVICE WITH IMPROVED HOUSING ATTACHMENT

[75] Inventor: Ronald E. Smith, Sunnymead, Calif.
[73] Assignee: Bourns, Inc., Riverside, Calif.
[21] Appl. No.: 670,439
[22] Filed: Nov. 9, 1984
[51] Int. Cl.⁴ .............................................. H01C 10/00
[52] U.S. Cl. ................................... 338/199; 336/192; 174/52 R; 339/128
[58] Field of Search .............. 339/128, 17 C; 336/192; 361/307; 174/52; 338/199, 202

[56] References Cited

U.S. PATENT DOCUMENTS 2,790,961  4/1957  Del Camp ...................... 336/192 X
2,958,063  10/1960  Stanwyck ...................... 339/128 X
3,386,010  5/1968  Nojiri ............................ 339/17 C X

*Primary Examiner*—Arthur T. Grimley
*Assistant Examiner*—C. Romano
*Attorney, Agent, or Firm*—Howard J. Klein; William G. Becker

[57] ABSTRACT

In an electronic device, of the type having an electronic component carried on a substrate, a housing to enclose the component, and terminal leads attached to the substrate, the housing is attached to the substrate by means of crimped tabs formed on extensions of the terminal leads. The extensions are directly generally perpendicularly to the substrate, and they terminate in inwardly-bent tabs which engage the housing in slots provided in the top surface of the housing. The tabs are crimped downwardly into the slots to lock the housing onto the substrate. An O-ring may optionally be retained in the housing, whereby the crimping of the tabs compresses the O-ring against the substrate to provide a substantially hermetic seal.

15 Claims, 5 Drawing Figures

U.S. Patent  Dec. 2, 1986  4,626,823
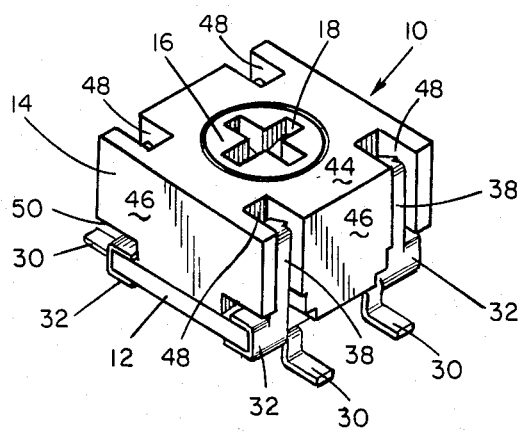
FIG. 1
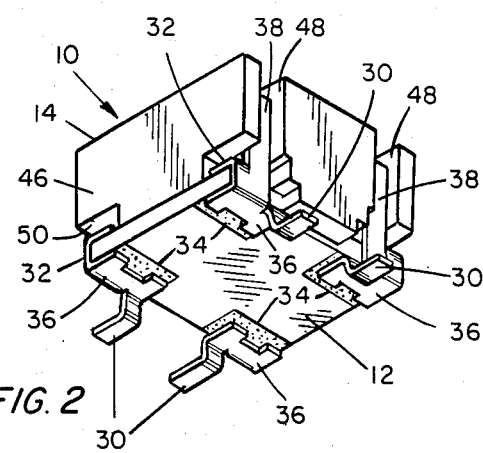
FIG. 2
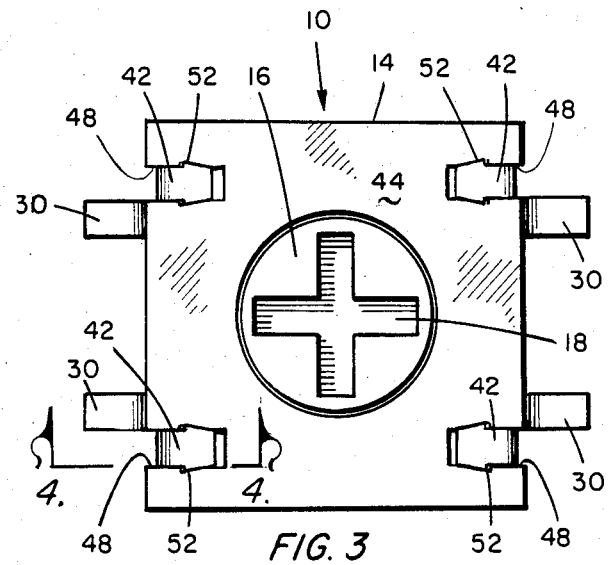
FIG. 3
FIG. 4
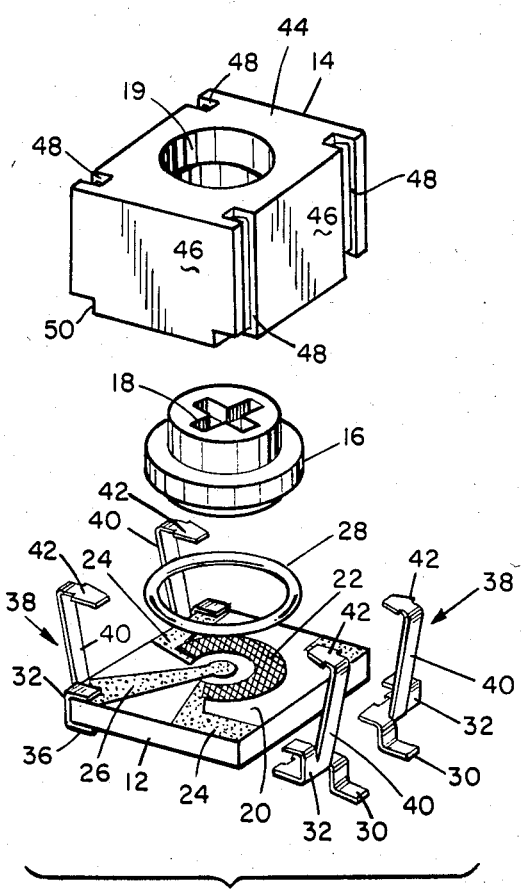
FIG. 5

MINIATURE ELECTRONIC DEVICE WITH IMPROVED HOUSING ATTACHMENT

BACKGROUND OF THE INVENTION

The present invention relates generally to the field of miniature solid-state electronic devices. More specifically, it relates to that class of such devices in which a component is carried on a substrate and enclosed within a housing, and in which the housing is sealingly attached to the substrate. The present invention provides an improvement in the attachment of the housing to the substrate.

In many miniature electronic devices, such as, for example, miniature trimming potentiometers, an electronic component is mounted or formed (e.g., by thick film printing) on the surface of a ceramic substrate, along with its associated conductive leads and termination pads. Terminal leads, for mounting the device directly on a printed circuit board or installing the device in a socket, are attached (as by soldering) to the termination pads, and the surface of the substrate carrying the component is enclosed within a housing.

It is frequently necessary that the housing be attached to the substrate in such a way as to form an hermetic seal therebetween. Typically, this has been accomplished by using an adhesive cement which sealingly bonds the housing to the substrate. A significant disadvantage to this attachment method is that the housing and substrate must be mechanically held together while the cement cures. Another disadvantage is that different temperature coefficients of expansion among the cement, the plastic of the housing, and the ceramic of the substrate can result in a loss of seal integrity when the electronic device is exposed to high temperatures.

The prior art has addressed these problems by employing various types of mechanical clips to keep the housing sealingly attached to the substrate. Such clipping mechanism have proven cumbersome to use and they have added complexity and cost to the manufacturing process.

There has thus been a long-felt, but as yet unfulfilled need for a way to provide an hermetic seal between the housing and the substrate which avoids the use either of cement, or of complex and cumbersome clip-type mechanisms.

SUMMARY OF THE INVENTION

Broadly, the present invention is an electronic device, of the type having an electronic component carried on a substrate, a housing to enclose the component, and terminal leads attached to the substrate to provide electrical connection to a circuit board or socket, wherein the housing is attached to the substrate by clips formed as extensions of the terminal leads.

More specifically, at least one lead on each of at least two opposed sides of the substrate is provided with an upwardly-extending extension, terminating in a free end. When the housing is placed on the substrate, the free ends of the extensions are bent inwardly and crimped into registering slots in the top surface of the housing. This crimping action firmly clamps the housing into engagement with the substrate.

If an hermetic seal is desired between the housing and the substrate, the inside of the housing can be provided with a seat for an O-ring. In that case, the clamping of the housing to the substrate traps and compresses the O-ring against the substrate to provide an hermetic seal between the substrate and the housing.

In a preferred embodiment, the free ends of the lead extensions are provided with barbs which firmly lock the free ends into the housing slots when the ends are crimped into the slots.

Another feature of a preferred embodiment is the provision of slots in the side walls of the housing extending from the top surface slots to the bottom edge of the housing. These side wall slots accommodate the unbent main portions of the lead extensions, so that they do not protrude beyond the side wall surfaces. Thus, the side wall slots give the finished device a "cleaner" appearance, while also saving space and lessening the likelihood of a short-circuiting contact between the lead extensions and another conductive element when the device is installed.

The use of the crimped lead extensions to lock the housing into place on the substrate has several advantages. First, the housing can be securely locked into place without the need for cement. Even if an hermetic seal is required, the construction of the present invention allows such a seal to be provided by the simple compression of an O-ring, rather than by cement. Thus, there need be no concern over degradation of a cement seal when the device is exposed to elevated temperatures.

In addition, the present invention offers ease and convenience of manufacture and use as compared with prior art clip-type attachment mechanisms. Conventional components are used, with easily implemented modifications (i.e., the housing slots and the lead extensions). In addition, the crimping of the free ends of the leads in an operation which is relatively easy to perform.

These and other advantages of the invention will be more readily appreciated from the detailed description which follows:

BRIEF DESCRIPTION OF THE DRAWINGS

FIG. 1 is a top perspective view of a miniature trimming potentiometer constructed in accordance with the present invention;

FIG. 2 is a bottom perspective view of the potentiometer of FIG. 1;

FIG. 3 is a top plan view of the potentiometer of FIG. 1;

FIG. 4 is a side elevational view of the potentiometer of FIG. 1, partially in cross-section along line 4—4 of FIG. 3; and FIG. 5 is an exploded perspective view of the potentiometer of FIG. 1.

DETAILED DESCRIPTION OF THE INVENTION

In this detailed description of a preferred embodiment of the invention, a miniature trimmer potentiometer is employed as an example of an electronic device which can be constructed in accordance with the present invention. The use of such an example is not meant to limit the scope of the invention in any way, but, rather, to illustrate but one of the many types of miniature electronic devices with which the present invention is advantageously used.

Referring now to the drawings, a miniature trimmer potentiometer 10, constructed in accordance with the present invention is shown. The potentiometer 10 includes a substrate 12, typically of ceramic, a housing 14, usually of plastic, and a rotor 16 rotatably mounted in the housing 14. The rotor 16 includes a slotted top 18 accessible through an aperture 19 in the top surface of the housing to allow the rotor to be turned by a suitable tool (not shown).

The internal components of the potentiometer 10 are shown, in simplified form, in FIG. 5. These internal components are conventional, and need only be described briefly for the purpose of providing an environment for the present invention. Thus, as shown in FIG. 5, the substrate 12 has a major surface 20 on which is provided an arcuate resistive element 22, an end conductive element 24 connected to each end of the resistive element 22, and a central conductive element 26 extending from the inside of the arc defined by the resistive element 22 to the edge of the substrate major surface 20. The resistive element 22 and the conductive elements 24, 26 are applied to the substrate by any conventional process, such as, for example, screen printing, and the arrangement of these elements, as shown in FIG. 5, is typical of state-of-the-art devices of this character.

As in a conventional miniature trimming potentiometer, the underside of the rotor 16 carries a conductive spring contact (not shown) to provide an electrical connection between the resistive element 22 and the central conductive element 26.

An O-ring 28 is advantageously retained in a seat 29 (FIG. 4) located within the housing 14 to provide effective sealing against the substrate 12, as will be more fully described below.

As in conventional electronic devices of the general type described herein, several of terminal leads 30 are attached to the substrate 12. Typically, as shown, two or more terminal leads 30 are attached to each of two opposed sides of the substrate, adjacent to its corners. The terminal leads 30 provide electrical connection to an electrical circuit, and may be of several configurations, depending upon whether, for example, the device is to be surface-mounted or socket-mounted.

The leads 30 are attached to the substrate 12 by integral lead clips 32, which are soldered to the outboard edges of the conductive elements 24, 26. In some devices, the conductive elements may be extended to the underside of the substrate 12, as shown in FIG. 2, each terminating in a conductive pad 34, to which a flat base 36 of each of the lead clips 32 is soldered.

Formed integrally with each of the lead/lead clip units 30, 32 is an extension 38 extending in a generally upward direction, approximately perpendicularly to the major surface 20 of the substrate 12. Each extension 38 has a generally vertical main portion 40 extending between the lead clip base 36 and a retention tab 42 near the upper free end of each extension. As will be described below, the extensions 38, including the tabs 42, act as clamps to attach the housing 14 to the substrate 12.

The housing 14 has a top surface 44, defined as the surface generally parallel to, and spaced from, the major surface 20 of the substrate 12. The housing also has several side surfaces 46, in the same number as the sides of the substrate 12; in the illustrated example, this number is four. The top surface 44 is provided with an inwardly-directed slot 48 near each of its corners, two of the slots 48 being disposed on each of two opposed sides of the housing 14. Each of the slots 48 also extends vertically down the height of an adjacent side surface 46 to the bottom edge of the housing 14. The slots 48 are located so that when the housing 14 is attached to the substrate 13 in the manner to be described, the slots 48 register with and receive the extensions 38.

The bottom edge of the housing 14, that is, the edge engageable with the substrate, advantageously includes a recess 50 at each corner to accommodate the lead clips 32.

As previously mentioned, the housing 14 is attachable to the substrate 12 to enclose the substrate major surface 20 and the electrical components thereon. This attachment is provided by the lead extensions 38 in the following manner:

The housing 14 is placed onto the substrate 12 so that the major surface 20 of the latter is covered, with the bottom edge of the housing engaging the substrate. As best shown in FIGS. 1, 2, and 4, the housing 14 is oriented with respect to the substrate 12 so that the terminal clips 32 are received in the recesses 50, and the main portions 40 of the lead extensions 38 are received in the vertical portions of the slots 48. The tabs 42 are then bent inwardly into the portions of the slots 48 located in the housing upper surface 44, thereby clamping the housing 14 to the substrate 12.

As best shown in FIG. 4, the portions of the slots 48 which are located in the housing top surface 44 are directed not only inwardly, but also, preferably, slightly downwardly. The tabs 42 of the lead extensions 38 can thus be crimped down into the slots 48 at an acute angle with the main portions 40 of the extensions 38, thereby providing a more effective clamping of the housing to the substrate.

The crimping of the extension tabs 42 into the slots 48 performs two functions. First, by means of the firm engagement between the tabs 42 and the registering slots 48, the housing 14 is lockably retained in engagement with the substrate 12. Second, the crimping action itself causes a compression of the O-ring 28 between its seat 29 in the housing and the surface 20 of the substrate.

By crimping the tabs 42 at an acute angle, another advantage is achieved in that the tabs 42 cannot easily be pulled out of the slots 48. This advantage can be further enhanced by providing the tabs 42 with barbs 52 to engage the side walls of the slots 48, locking the tabs therein.

The result of the intimate engagement between the housing 14 and the substrate 12, and the compression of the O-ring 28 therebetween, is to create a substantially hermetic seal between the housing and the substrate, without the need for any adhesive cementing agent. Thus, the problem of poor seal integrity at high temperatures is avoided, as is the need to hold the housing and the substrate together mechanically while the cement cures.

It should be noted that while the extensions of the slots 48 through the side walls 46 of the housing is not necessary for the lockable attachment of the housing, this slot configuration allows the main portions 40 of the extensions 38 to be recessed inwardly from the exterior of the housing side surfaces 46. Thus, the device is given more compact dimensions and a "cleaner" appearance, while eliminating any unnecessarily protruding conductive surfaces which could cause inadvertent short circuits when the device is installed.

It can thus be appreciated from the foregoing that the present invention provides effective housingto-substrate sealing, even hermetically (with the use of the O-ring), without the problems associated with adhesive cementing agents. In addition, it will be appreciated that the use of an integral extension of the terminal leads as the means for attaching the housing to the substrate provides a very simplyconstructed substitute for the relatively complex clipping mechanisms of the prior art. Thus, no additional components are used; only existing components with modifications that are easily implemented.

The result is an effective and efficient attachment and sealing mechanism which is relatively simple and inexpensive to manufacture.

What is claimed is:

1. An electronic device, of the type including an electronic component carried on a substrate, a housing having top and side surfaces enclosing said component, and terminal leads attached to said substrate on each of at least two opposed sides thereof, wherein the improvement comprises:

an upwardly-extending extension attached to at least one of said terminal leads on each of said two opposed sides of said substrate, each of said extensions having a main portion and a free end;

retention means, on said free end of each of said extensions, and engageable with said top surface of said housing, for lockably retaining said housing in engagement with said substrate; and slot means, in said side surfaces of said housing, for receiving said main portion of each of said extensions, said main portions being thereby recessed inwardly from said side surfaces, substantially without protruding from said side surfaces.

2. The electronic device of claim 1, wherein retention means comprises:

an inwardly-bent portion of said free end of each of said extensions.

3. The electronic device of claim 2, wherein said slot means extends into said top surface for receiving each of said bent portions.

4. The electronic device of claim 2, wherein each of said bent portions forms an acute angle with said main portion of its associated extension.

5. The electronic device of claim 3, wherein each of said bent portions includes a barb engageable with said housing in said slot means.

6. An electronic device, comprising:

a substrate carrying an electronic component on a major surface thereof;

a housing having top and side surfaces enclosing said major surface of said substrate on which said component is carried;

a terminal lead attached to each of at least two opposed sides of said substrate, each of said leads having a first portion engageable with said substrate, and a second portion extending perpendicularly to said major surface carrying said component;

retention means, on said second portion of each of said terminal leads, and engageable with said housing, for lockably retaining said housing in engagement with said substrate; and slot means in said top and side surfaces of said housing, for receiving said second portion and said retention means of each of said terminal leads, said second portions being thereby recessed inwardly from said side surfaces substantially without protruding from said side surfaces.

7. The electronic device of claim 6, wherein said second portion of each of said terminal leads terminates in a free end, and wherein said retention means comprises a third portion of said extension formed by an inwardly-directed bend in said second portion near said free end thereof.

8. The electronic device of claim 7, wherein said third portion of each of said terminal leads registers with, and is received in said slot means in said top surface of said housing.

9. The electronic device of claim 8, wherein said top surface is defined as the surface spaced from and substantially parallel to said major surface of said substrate, and each of said side surfaces extends from said top surface to an edge engageable with said major surface of said substrate, and wherein said slot means comprises a plurality of slots in said top surface, each of said slots extending from said top surface through an adjacent side surface to said edge thereof to receive said second portion of one of said terminal leads.

10. The electronic device of claim 9, wherein said third portion of each of said terminal leads forms an acute angle with said second portion.

11. The electronic device of claim 8, wherein said third portion of each of said terminal leads is provided with a barb which lockably engages with said slot means.

12. An electronic device, comprising:

a substrate carrying an electronic component on a major surface thereof;

a housing enclosing said major surface of said substrate on which said component is carried, said housing having a top surface spaced from and substantially parallel to said substrate, and a plurality of side surfaces each extending from said top surface to said major surface of said substrate;

a terminal lead attached to each of at least two opposed sides of said substrate, each of said leads having a first portion engageable with said substrate, a second portion extending perpendicularly to said major surface carrying said component, and a third portion provided at the end of said second portion and forming an angle of not more than approximately ninety degrees therewith; and a plurality of slots each extending from said top surface through an adjacent side surface to an edge thereof engageable with said major surface of said substrate;

whereby said third portion of each of said leads is engageable with one of said slots in said top surface of said housing to lockably retain said housing in engagement with said substrate; and whereby said second portion of each of said leads is received in one of said slots so as to be recessed inwardly from said side surface substantially without protruding therefrom.

13. The electronic device of claim 12, wherein said third portion of each of said leads forms an acute angle with said second portion thereof.

14. The electronic device of claim 13, wherein said third portion of each of said leads includes a barb near the end thereof which is received in said slot in said top surface of said housing.

15. The electronic device of claim 12, further comprising:

an O-ring; and means in said housing for retaining and compressing said O-ring into a sealing engagement with said substrate when said retention means are engaged with said housing.

* * * * *

UNITED STATES PATENT OFFICE
CERTIFICATE OF CORRECTION

Patent No. 4,626,823   Dated   December 2, 1986

Inventor(s) Ronald E. Smith

It is certified that error appears in the above-identified patent and that said Letters Patent are hereby corrected as shown below:

Column 1, Line 40, "mechanism" should read -- mechanisms --

Column 2, Line 34, "leads in an" should read -- leads is an --

Column 4, Line 65, "housingto" should read -- housing-to --

Column 5, Line 33, "portion of" should read -- portion on --

Signed and Sealed this

Eleventh Day of August, 1987

Attest:

DONALD J. QUIGG

Attesting Officer   Commissioner of Patents and Trademarks